(12) United States Patent
Biunno et al.

(10) Patent No.: US 6,940,038 B2
(45) Date of Patent: *Sep. 6, 2005

(54) LASER TRIMMING OF RESISTORS

(75) Inventors: Nicholas Biunno, Santa Clara, CA (US); Atul Patel, Fremont, CA (US); Ken Ogle, Los Gatos, CA (US); George Dudnikov, San Jose, CA (US)

(73) Assignee: Sanmina-SCI Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/454,253

(22) Filed: Jun. 3, 2003

(65) Prior Publication Data

US 2004/0099647 A1 May 27, 2004

Related U.S. Application Data

(63) Continuation-in-part of application No. 10/302,099, filed on Nov. 21, 2002.

(51) Int. Cl.[7] .............................................. B23K 26/38
(52) U.S. Cl. ............................ 219/121.69; 219/121.68; 700/166
(58) Field of Search .................... 338/195; 219/121.68, 219/121.69; 700/166; 29/835, 836

(56) References Cited

U.S. PATENT DOCUMENTS

| | | | | |
|---|---|---|---|---|
| 4,566,936 A | * | 1/1986 | Bowlin | 216/16 |
| 4,870,746 A | * | 10/1989 | Klaser | 29/620 |
| 4,998,207 A | * | 3/1991 | Postlewait | 700/166 |
| 5,347,258 A | * | 9/1994 | Howard et al. | 338/333 |
| 5,443,534 A | * | 8/1995 | Vinciarelli et al. | 29/593 |
| 5,446,260 A | * | 8/1995 | Uhling et al. | 219/121.69 |
| 5,502,468 A | | 3/1996 | Knierim | |
| 5,504,470 A | | 4/1996 | Ginn | |
| 5,504,681 A | | 4/1996 | Sherman | |
| 5,504,986 A | | 4/1996 | Casey et al. | |
| 5,519,396 A | | 5/1996 | Distinti | |
| 5,525,910 A | | 6/1996 | Uhling et al. | |
| 5,569,398 A | | 10/1996 | Sun et al. | |
| 5,585,554 A | | 12/1996 | Handfield et al. | |
| 5,600,071 A | | 2/1997 | Sooriakumar et al. | |
| 5,602,483 A | | 2/1997 | Uhling et al. | |
| 5,603,847 A | * | 2/1997 | Howard et al. | 216/17 |
| 5,617,298 A | | 4/1997 | Casey et al. | |
| 5,701,097 A | | 12/1997 | Fisher et al. | |
| 5,708,569 A | * | 1/1998 | Howard et al. | 361/760 |
| 5,753,571 A | | 5/1998 | Donohue | |

(Continued)

Primary Examiner—Geoffrey S. Evans
(74) Attorney, Agent, or Firm—Wilson Sonsini Goodrich & Rosati

(57) ABSTRACT

Improved systems and methods for laser trimming resistors printed on a substrate layer are provided. An exemplary embodiment measures a resistance value for each annular resistor and sorts the annular resistors into one or more bins based on the measured resistance values and target resistance values associated with each resistor. A laser trim file may then be assigned to each bin based on a predictive trim formulation, where each laser trim file defines a set of configuration parameters for a laser drill to conform each resistor with their respective target value. The laser drill uses the laser trim files to trim the resistors within each bin in accordance with the laser trim file assigned to that bin.

30 Claims, 9 Drawing Sheets

U.S. PATENT DOCUMENTS

| | | |
|---|---|---|
| 5,771,012 A | 6/1998 | Shu et al. |
| 5,779,918 A | 7/1998 | Inoue et al. |
| 5,795,069 A | 8/1998 | Mattes et al. |
| 5,850,171 A | 12/1998 | Lin et al. |
| 5,851,864 A | 12/1998 | Ito et al. |
| 5,856,695 A | 1/1999 | Ito et al. |
| 5,874,887 A | 2/1999 | Kosinski |
| 5,881,451 A | 3/1999 | Kneezel et al. |
| 5,900,530 A | 5/1999 | O'Brien et al. |
| 5,926,123 A | 7/1999 | Ostrom et al. |
| 5,939,693 A | 8/1999 | Roeckner et al. |
| 5,946,210 A | 8/1999 | Montminy et al. |
| 5,958,606 A | 9/1999 | Wang et al. |
| 5,969,658 A | 10/1999 | Naylor |
| 5,973,631 A | 10/1999 | McMullen et al. |
| 5,977,797 A | 11/1999 | Gasparik |
| 5,977,863 A | 11/1999 | Bloom et al. |
| 5,994,755 A | 11/1999 | DeJong et al. |
| 5,994,997 A * | 11/1999 | Brown et al. ............... 338/309 |
| 5,995,033 A | 11/1999 | Roeckner et al. |
| 6,005,275 A | 12/1999 | Shinogi et al. |
| 6,020,785 A | 2/2000 | Allen et al. |
| 6,041,007 A | 3/2000 | Roeckner |
| 6,072,943 A | 6/2000 | Gasparik et al. |
| 6,084,424 A | 7/2000 | Gasparik |
| 6,100,815 A | 8/2000 | Pailthorp |
| 6,107,909 A | 8/2000 | Kosinski |
| 6,120,835 A | 9/2000 | Perdieu |
| 6,130,601 A * | 10/2000 | Brown et al. ............... 338/307 |
| 6,140,872 A | 10/2000 | McEldowney |
| 6,150,681 A | 11/2000 | Allen |
| 6,180,164 B1 | 1/2001 | Ellis et al. |
| 6,187,372 B1 | 2/2001 | Johnson et al. |
| 6,225,035 B1 * | 5/2001 | Zhang et al. ............... 430/330 |
| 6,225,576 B1 | 5/2001 | Poole et al. |
| 6,246,312 B1 | 6/2001 | Poole et al. |
| 6,256,876 B1 | 7/2001 | Ohe et al. |
| 6,259,151 B1 | 7/2001 | Morrison |
| 6,268,225 B1 | 7/2001 | Chen et al. |
| 6,329,260 B1 | 12/2001 | DeJong et al. |
| 6,337,110 B1 | 1/2002 | Delaunay et al. |
| 2003/0178396 A1 * | 9/2003 | Naumov et al. ....... 219/121.69 |

* cited by examiner

Test Board Print / Trim / Final Yield Summary for core layer 3 at 1080 resistors per core

| Core | Average | | | 1 Stdv | | | Yield | | |
|---|---|---|---|---|---|---|---|---|---|
| | 1st Test | 2nd Test | Final Test | 1st Test | 2nd Test | Final Test | <0.70> 1st Test | <0.70> 2nd Test | <0.60> Final Test |
| 1 | 0.54 | 0.70 | 0.60 | 0.06 | 0.04 | 0.04 | 0 | 9 | 9 |
| 2 | 0.54 | 0.70 | 0.59 | 0.07 | 0.07 | 0.06 | 0 | 9 | 9 |
| 3 | 0.55 | 0.68 | 0.61 | 0.08 | 0.06 | 0.05 | 0 | 9 | 9 |
| 4 | 0.53 | 0.70 | 0.61 | 0.07 | 0.04 | 0.05 | 0 | 9 | 9 |
| 5 | 0.53 | 0.71 | 0.65 | 0.07 | 0.05 | 0.06 | 0 | 9 | 5 |
| 6 | 0.52 | 0.68 | 0.60 | 0.07 | 0.05 | 0.05 | 0 | 9 | 9 |
| 7 | 0.48 | 0.67 | 0.59 | 0.07 | 0.05 | 0.06 | 0 | 9 | 9 |
| 8 | 0.52 | 0.68 | 0.58 | 0.06 | 0.04 | 0.04 | 0 | 9 | 9 |
| 9 | 0.46 | 0.67 | 0.59 | 0.07 | 0.07 | 0.07 | 0 | 8 | 8 |
| 10 | 0.45 | 0.74 | 0.66 | 0.07 | 0.09 | 0.12 | 0 | 8 | 8 |
| 11 | 0.47 | 0.73 | 0.62 | 0.09 | 0.06 | 0.06 | 0 | 9 | 9 |
| 12 | 0.48 | 0.68 | MIA | 0.08 | 0.09 | MIA | 0 | 8 | MIA |
| 13 | 0.50 | 0.68 | 0.58 | 0.07 | 0.10 | 0.05 | 0 | 8 | 9 |
| 14 | 0.48 | 0.65 | 0.56 | 0.05 | 0.04 | 0.04 | 0 | 9 | 9 |
| 15 | 0.47 | 0.69 | 0.63 | 0.06 | 0.07 | 0.04 | 0 | 9 | 9 |
| | 0.50 | 0.69 | 0.61 | 0.07 | 0.06 | 0.06 | 0 / 0% | 132 / 98% | 120 / 96% |

FIG. 4A

Test Board Print / Trim Final Yield summary for core layer 18 at 720 resistors per core

| Core | Average 1st Test | Average 2nd Test | Average Final Test | 1 Stdv 1st Test | 1 Stdv 2nd Test | 1 Stdv Final Test | Yield <0.70> 1st Test | Yield <0.70> 2nd Test | Yield <0.60> Final Test |
|---|---|---|---|---|---|---|---|---|---|
| 1 | 0.45 | 0.69 | 0.62 | 0.07 | 0.03 | 0.04 | 0 | 9 | 9 |
| 2 | 0.43 | 0.70 | 0.62 | 0.05 | 0.04 | 0.04 | 0 | 9 | 9 |
| 3 | 0.44 | 0.70 | 0.63 | 0.06 | 0.04 | 0.04 | 0 | 9 | 9 |
| 4 | 0.42 | 0.69 | 0.59 | 0.05 | 0.05 | 0.06 | 0 | 8 | 8 |
| 5 | 0.48 | 0.70 | 0.63 | 0.06 | 0.05 | 0.04 | 0 | 9 | 8 |
| 6 | 0.48 | 0.69 | 0.62 | 0.06 | 0.06 | 0.04 | 0 | 7 | 9 |
| 7 | 0.43 | 0.71 | 0.66 | 0.10 | 0.09 | 0.06 | 0 | 8 | 3 |
| 8 | 0.34 | 0.69 | 0.58 | 0.09 | 0.09 | 0.04 | 0 | 8 | 9 |
| 9 | 0.42 | 0.73 | 0.64 | 0.06 | 0.06 | 0.05 | 0 | 8 | 8 |
| 10 | 0.48 | 0.70 | 0.63 | 0.07 | 0.09 | 0.06 | 0 | 9 | 7 |
| 11 | 0.42 | 0.70 | 0.64 | 0.06 | 0.05 | 0.05 | 0 | 9 | 8 |
| 12 | 0.36 | 0.75 | MIA | 0.05 | 0.06 | MIA | 0 | 8 | MIA |
| 13 | 0.40 | 0.72 | 0.61 | 0.07 | 0.08 | 0.08 | 0 | 9 | 8 |
| 14 | 0.40 | 0.67 | 0.62 | 0.05 | 0.04 | 0.07 | 0 | 9 | 8 |
| 15 | 0.45 | 0.70 | 0.65 | 0.10 | 0.05 | 0.04 | 0 | 9 | 6 |
|  | 0.43 | 0.70 | 0.62 | 0.07 | 0.06 | 0.05 | 0 | 128 | 109 |
|  |  |  |  |  |  |  | 0% | 95% | 87% |

FIG. 4B

Best core match combine yield after lamination and final test

| Core # | | Layer Yield | | Combined Yield | |
| --- | --- | --- | --- | --- | --- |
| L3 | L18 | L3 | L18 | Lamination | Final |
| 1 | 1 | 9 | 9 | 9 | 9 |
| 2 | 2 | 9 | 9 | 9 | 9 |
| 3 | 3 | 9 | 9 | 9 | 9 |
| 4 | 4 | 9 | 9 | 9 | 8 |
| 5 | 6 | 9 | 9 | 9 | 5 |
| 6 | 11 | 9 | 9 | 9 | 9 |
| 7 | 12 | 9 | 9 | 9 | 4 |
| 8 | 14 | 9 | 9 | 9 | 9 |
| 9 | 15 | 9 | 9 | 9 | 7 |
| 10 | 13 | 8 | 8 | 8 | 6 |
| 11 | 9 | 9 | 8 | 8 | 8 |
| 12 | 10 | 8 | 8 | 7 | MIA |
| 13 | 8 | 8 | 8 | 7 | 9 |
| 14 | 7 | 9 | 7 | 7 | 8 |
| 15 | 5 | 9 | 8 | 8 | 6 |
| | | 132 | 128 | 126 | 106 |
| | | 98% | 95% | 93% | 85% |

FIG. 5

LASER TRIMMING OF RESISTORS

REFERENCE TO RELATED APPLICATION

The present application is a continuation-in-part of co-pending U.S. Ser. No. 10/302,099 filed Nov. 21, 2002, pending U.S. application Ser. No. 10/302,099 is hereby incorporated herein by reference in its entirety.

BACKGROUND

1. Field of Invention

The present invention generally relates to fabrication of electronic circuit elements, and more particularly, to systems and methods for laser trimming of passive components fabricated on a substrate layer.

2. Description of Related Art

Resistors fabricated on substrate layers offer significant electrical performance advantages over surface mount resistors. The problem, however, is that printed circuit board and other circuit substrate manufacturers must fabricate these resistors on the substrate layer with the desired nominal and tolerance values at the time the substrate layer is being manufactured. Because printed resistors are typically buried within a printed circuit board or other circuit platform under one or more lamination layers, the platform manufacturer is generally unable to correct defects at a later time. The need to properly fabricate resistors the first time for both nominal and tolerance values has been an inhibiting factor for high yield and high volume buried resistor processes. These problems have become especially apparent for printed circuit boards having resistors printed on multiple layers. If resistors at one layer fail to meet the required specifications, the entire circuit board may be defective. As a result, multi-layered printed circuit boards and other circuit platforms such as multi-chip modules, hybrid circuits and chip packages typically suffer from exceptionally low yields.

Conventional approaches have attempted to alleviate these problems by performing laser trimming of resistors to conform the resistors to the required nominal and tolerance values. Generally, there are two basic ways to produce a change (higher ohms) in thick polymer resistors: (a) reducing or changing the path of current through the resistor in terms of magnitude and direction; and (b) reducing or changing the cross-sectional area perpendicular to the direction of current flow. The first method is typically performed by making a trim slice through a portion of the resistor to create a localized reduction in the cross-sectional area relative to the direction of current flow. This method, however, distorts the electrical field around the slice cut and can produce undesirable variations in the impedance of the resistor at higher frequency. The second approach performs a planar cut to reduce the cross-sectional area of the resistor in the direction of current flow. Because only the magnitude of the current is affected and not the direction, high frequency impedance will not be significantly affected.

Although some forms of trimming may perform well for the more traditional square resistors, the recent introduction of annular resistors presents unique problems. Due to the different physical geometries of annual resistors, conventional laser trimming equipment and processes may be unsuitable for laser trimming annular resistors. In addition, printed circuit board manufacturers may be unwilling to incur the cost of purchasing special-purpose laser trimming equipment, which can exceed one million dollars per laser trimming tool, or modify existing laser trimming equipment to perform laser trimming of annular resistors. For circuit substrate layers having a large number of buried resistors or resistors printed on multiple layers, conventional laser trimming processes can also be difficult and time consuming due to the need to select laser trimming settings for each resistor. Furthermore, because conventional laser trimming approaches typically do not collect and display statistical information in a meaningful way, the circuit board manufacturer may have insufficient information to adjust laser trimming process or the underlying print screening processes.

Therefore, in light of the problems associated with existing approaches, there is a need for improved systems and methods for laser trimming of components.

SUMMARY OF THE INVENTION

Embodiments of the present invention alleviate many of the foregoing problems by providing improved systems and methods for laser trimming of passive components. In one embodiment of the present invention, a resistance value for each resistor printed on a substrate layer is measured. The resistors are then sorted into one or more bins based on the measured resistance value and target resistance value associated with each annular resistor. A laser trim file is assigned to each bin using a predictive trim formulation, where each laser trim file defines a set of configuration parameters for a laser drill to conform each resistor to their respective target value. A laser drill may then be used to trim the resistors within each bin in accordance with the laser trim file assigned to that bin.

Other embodiments of the present invention may configure the laser trim file to define a drill pattern on the resistor to form a planar channel within the resistor. For example, the laser drill file may include a laser beam step size, an overlap factor and number of feed steps across the resistor that causes the laser drill to form a planar channel of the desired shape and depth. A trim application may also be used to display a distribution of the trimmed resistance values and other statistical information to determine the performance of the laser drill file associated with particular bins. This statistical information may be used by the circuit substrate manufacturer to adjust the parameters of the laser drill files. By using readily available laser drills, instead of special purpose laser trimming equipment, circuit board manufactures can reduce equipment costs by leveraging general purpose laser drills that may already be used by the manufacturer for other purposes. Furthermore, by automatically assigning laser drill files to resistor bins based on a predictive trim formulation, the time consuming task of selecting laser trimming settings for each resistor can be avoided. In other embodiments, the statistical information provided by the laser trim application may also enhance the performance of laser trimming and increase circuit board yields by providing sufficient information regarding the laser trimming process or underlying print screen process to enable the manufacturer to take appropriate action.

BRIEF DESCRIPTION OF THE DRAWINGS

These and other features and advantages of the present invention will become more apparent to those skilled in the art from the following detailed description in conjunction with the appended drawings in which:

FIGS. 4A and 4B illustrate exemplary yields achieved by processes performed in accordance with embodiments of the present invention; and FIG. 5 illustrates exemplary yields for layered circuit boards achieved by processes performed in accordance with embodiments of the present invention.

DETAILED DESCRIPTION

Embodiments of the present invention provide systems and methods for laser trimming of passive components on a—circuit-substrate layers, such as annular passive components on a printed circuit board. The following description is presented to enable a person skilled in the art to make and use the invention. Descriptions of specific applications are provided only as examples. Various modifications, substitutions and variations of the preferred embodiment will be readily apparent to those skilled in the art, and the generic principles defined herein may be applied to other embodiments and applications without departing from the spirit and scope of the invention. Thus, the present invention is not intended to be limited to the described or illustrated embodiments, and should be accorded the widest scope consistent with the principles and features disclosed herein.

Figure 1A:
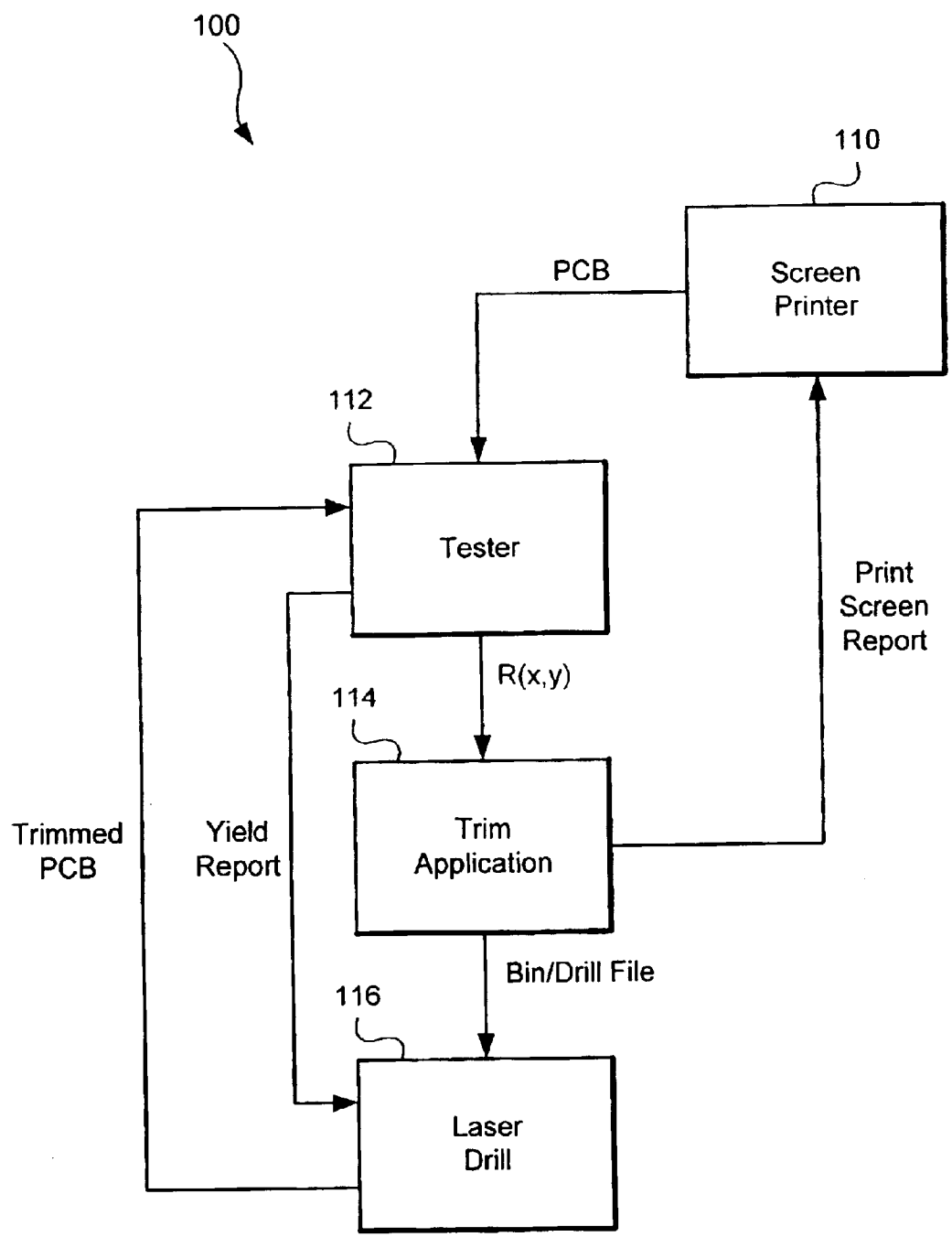
FIG. 1A illustrates a block diagram of an exemplary system in which the principles of the present invention may be advantageously practiced.

Referring to FIG. 1A, a block diagram of an exemplary system in which the principles of the present invention may be advantageously practiced is illustrated generally at 100. As illustrated, the exemplary system includes a screen printer 110, a resistance tester 112, a trim application 114 and a laser drill 116. In operation, printed circuit boards or other substrate layers with fabricated resistors using the screen printer 110 are provided to the resistance tester 112, which probes each resistor on the printed circuit board and measures the associated resistance. The resistance tester 112 outputs a file that provides the location (x, y coordinates) of each resistor and the associated resistance value. The trim application 114 then uses the output of the resistance tester 112 to generate a screen printing report. As will be discussed in further detail in connection with FIG. 2, this report may be configured to display a distribution of the measured resistance values and other statistical information that may then be used to adjust the processes used by the screen printer 110.

According to certain embodiments, a circuit substrate layer comprises a composite plane layer consisting of one or more conductive layers (such as copper) laminated or bonded to a dielectric layer. For multi-layer circuit board applications the circuit substrate layer typically consist of two conductive layers bonded to both sides of a dielectric layer. A multi-layer printed circuit board includes multiple circuit substrate layers. The dielectric layer can be reinforced such as with FR-406 glass-resin systems according to an embodiment. Alternatively the dielectric layer may be non-reinforced such as in the case of capton, teflon, or polyamide. One embodiment of the circuit substrate layer consists of a 0.002" thick FR-406 dielectric layer with ½ oz (0.0008" thick) copper foil bonded to each side of the dielectric.

The trim application 114 may also be configured to sort the resistors into one or more bins based on the measured resistance value and target resistance value. For example, the trim application 114 may be configured to divide a range of resistance values into a plurality of bins having a predetermined step size (e.g. 0.5 ohms). For resistors having the same target value, the trim application 114 uses the measured resistance value for these resistors to place the resistors in the appropriate bin. The trim application 114 then assigns a laser drill file to each bin based on a predictive trim formulation in order to conform the resistors within each bin to the target resistance value for that bin. Each drill file uses knowledge of the resistor material and geometry to define a set of control parameters for the laser drill 116, such as laser beam spot size, pulse duration, energy level, aperture, angle, etc., that will be used to control the laser drill 116 to adjust the resistors within each bin. The laser drill file uses a predictive trim methodology to determine the amount of material to trim and the trim pattern that will predictively change the actual resistor value to conform with the target resistor value.

Once the laser drill 116 trims each resistor within each bin in accordance with the corresponding laser drill file, the trimmed circuit substrate layer may then be provided to the resistance tester 112 to perform a second resistor test of the circuit substrate layer. The resistance tester 112 then generates a yield report that provides information regarding whether particular circuit boards passed predefined pass/fail criteria. The measured resistance values for the trimmed resistors may also be provided to the trim application 114 in order to display a distribution of the measured resistance values and other statistical information regarding the performance of laser drill files associated with selected bins. As will be discussed in further detail below, this information may be used to adjust trim tool files associated with particular bins in order to fine tune the performance of particular laser drill files.

Figure 1B:
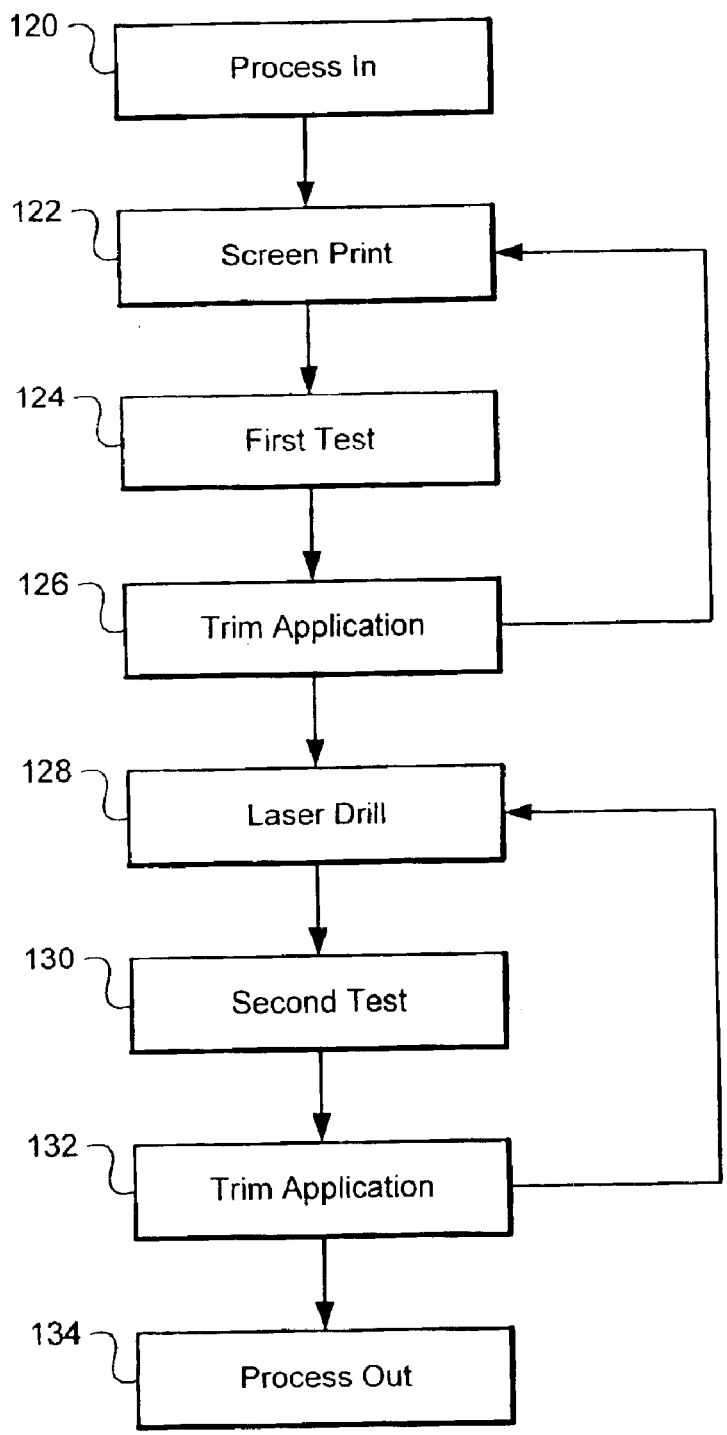
FIG. 1B illustrates a flow diagram of an exemplary system and in accordance with one embodiment of the invention.

FIG. 1B illustrates a flow diagram of an exemplary system and in accordance with one embodiment of the invention. The process flow is shown as part of a larger process flow of processing a printed circuit board or substrate layers in a fabrication process. Preceding steps of the process are shown generally as block 120. Next a screen print operation is performed (block 122). Resistors are printed on a printed circuit board or other substrate layer using a screen printer. The resistors are tested in a first test operation (block 124). A trim application runs (block 126). The trim operation includes, according to one embodiment, loading and analyzing the test data with resistance values, configuring a tool set, mapping resistors to drill tools and formatting a file to be provided to a laser drill. The trim files are mapped to respective sets of resistors and a file embodying the respective commands for the laser drill is formatted. Information regarding the resistance values can be used in later screen print operations for the purpose of process improvement, as shown with the connection from block 126 to 122. The laser drill operates based on information provided by trim application (block 128). For example, the resistors are trimmed according to the drill tools that have been mapped to the respective resistors. After such laser drill operation an additional, second test is performed on the resistors (block 130). The trim application runs again based on information on the second test (block 132). In such operation, the trim application loads and analyzes resistance data collected in the second test. Additional laser trimming may be performed based on such measurements. Next, the resulting materials are provided for further processing (block 134). Information regarding the resistance values received from the first or second tests can be used in later laser drill operations for the purpose of process improvement, as shown with the connection from block 132 to 128.

Figure 1C:
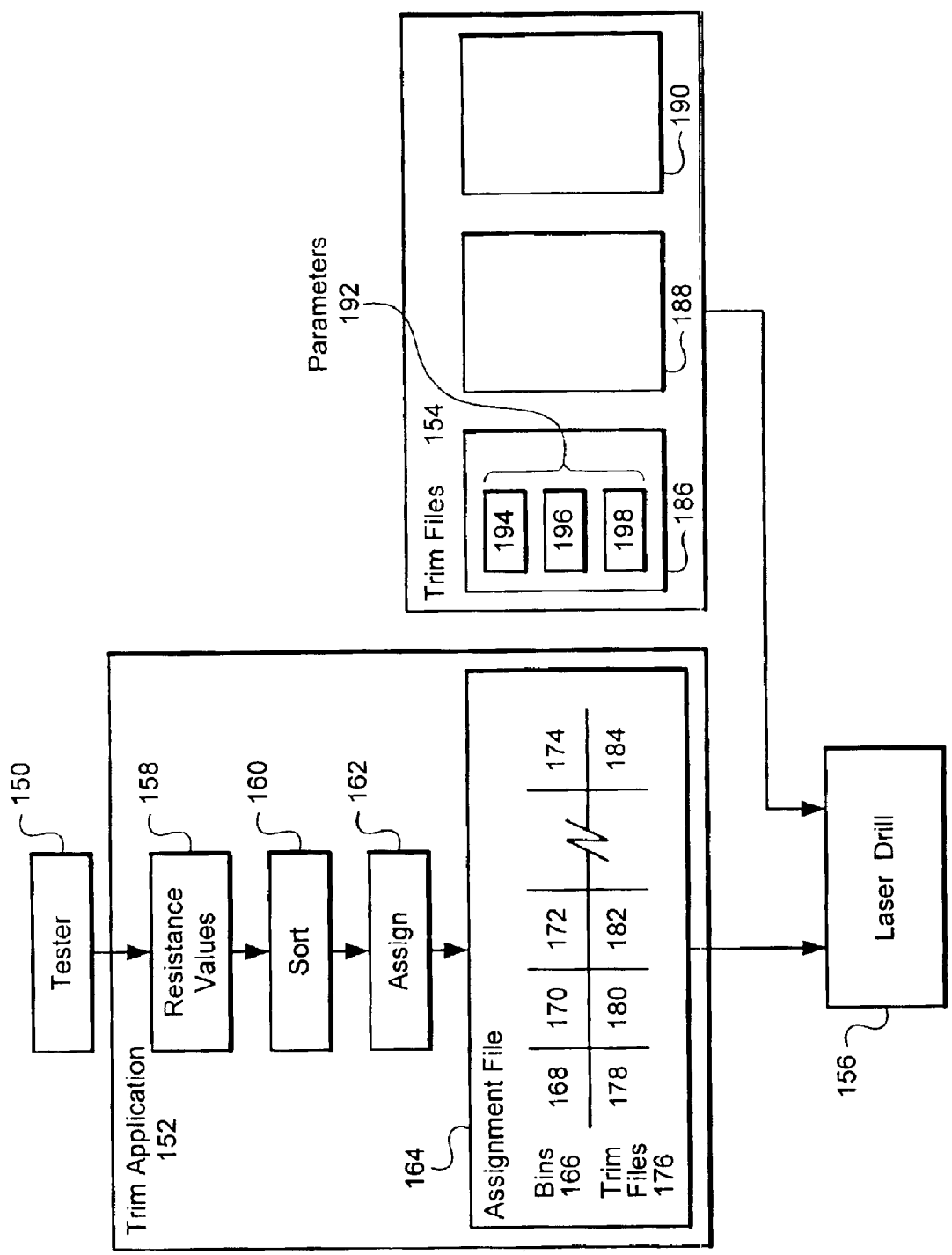
FIG. 1C illustrates a block diagram of an exemplary system including details of a trim application in accordance with one embodiment of the invention.

FIG. 1C illustrates a block diagram of an exemplary system including details of a trim application in accordance with one embodiment of the invention. The system shown generally in FIG. 1C includes tester 150, trim application 152, trim files 154 and laser drill 156. Trim application 152 includes resistance values 158, sort module 160, assign module 162 and assignment file 164. Assignment file 164 includes bins 166 such as bins 168, 170, 172, 174 and trim file designation 176 such as trim file designation 178, 180, 182 and 184. Trim files 154 include files such as 186, 188, and 190. Each file contains parameters such as parameters 192, which includes exemplary parameters 194, 196, 198.

Trim application 152 is configured to receive input from tester 150 and provide assignment information to laser drill 156. Laser drill 156 also receives trim files 154. Trim application 152 receives resistance values 158 from tester 154 for the respective resistors tested. Resistor values 158 in trim application 152 are provided to sort module 160, the result of which is provided to assign module 162. Assign module 162 outputs assignment file 164. Resistors are sorted based on resistant values into various bins. Then, different trim files are assigned to respective bins by assign module 162, which creates a file containing the assignment 165 between bins 166 and respective trim file designation 176. Assignment file 164 and trim files 154 are uploaded to laser drill 156, which performs drilling operations on the respective resistors based on the assigned file and assigned trim files.

Figure 2A:
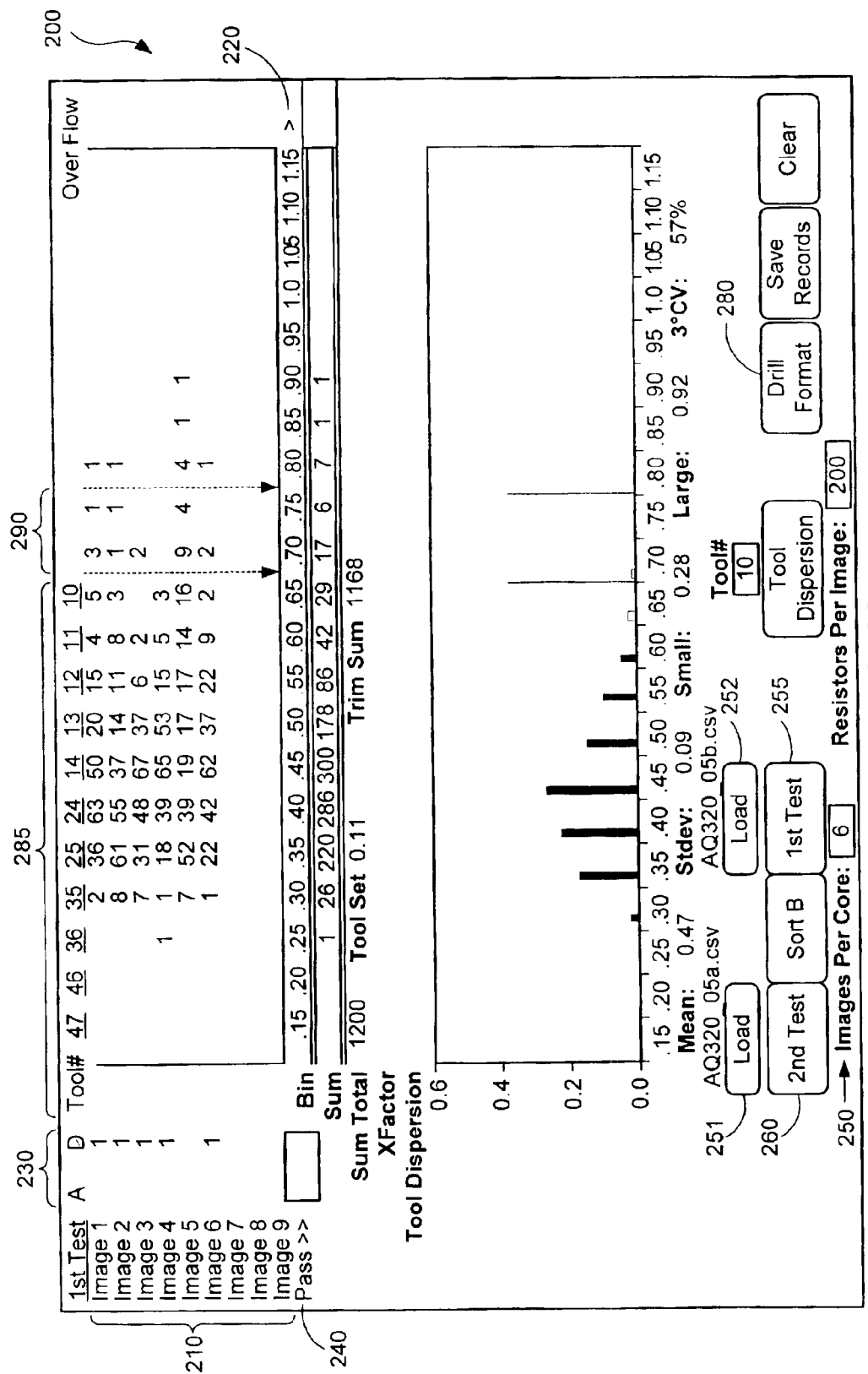
FIG. 2A illustrates an exemplary trim tool assignment interface in accordance with one embodiment of the present invention.

Referring to FIG. 2A, an exemplary trim tool assignment interface for the trim application in accordance with one embodiment of the present invention is illustrated generally at 200. The exemplary interface is intended to provide graphical and statistical information that allows the user to quickly view both screen printing and laser trimming process control. The exemplary interface of FIG. 2A is shown displaying exemplary data for a 1200 resistor test substrate layer for circuit images after screen printing. The sorted resistance data is displayed numerically by image 210 and by resistance bin 220. In this example, the bin resolution is 0.05 ohm and has a start channel of 0.15 ohm and an end channel of 1.15 ohm. Pass/fail results are displayed by image for both mean value (A) and distribution (D) in the upper left corner of the display as illustrated generally at 230, with a total pass per core calculated and displayed at 240. The upper and lower tolerance values for the resistor core are also illustrated by upper and lower lines shown generally at 290.

The user controls the application using the command buttons and numerical inputs at the bottom of the display. The number of images per core and the number of resistors per image are first input into the trim application at the bottom of the display as illustrated generally at 250. The user can then load data into the trim application using the load buttons 251, 252. By pressing the first test button 255, the user can sort and display the data stored in the file indicated above the first load button 251 (which may correspond to data gathered after screen printing). Conversely, by pressing the second test button 260, the user can sort and display the data stored in the file indicated above the second load button 252 (which may correspond to data gathered after laser trimming). In this way, the user can quickly switch between examining screen printing process control and laser trimming process control.

The Sort B button 270, in addition to performing the functions of the first and second test buttons 251, 252, will sort the resistors into their assigned bins and assign a laser drill file to each bin. The laser drill file numbers for resistance bin assignments are displayed in the gray field at the top of the interface as illustrated generally at 285. As mentioned previously, the trim application assigns laser drill files based on the amount the resistors within the assigned bin must be changed in order to conform with target resistance specifications. For example, as illustrated in FIG. 2A, laser drill file #35 would be configured to produce a relatively large change in resistance values for resistors within bin 0.30 with respect to the target value of 0.70. Conversely, laser drill file #10 would produce a relatively small incremental change in resistance values to the resistors within bin 0.65 with respect to a target value of 0.70.

Each laser drill file includes parameters for controlling a laser drill, such as a Hitachi NLC-1B21E-10C $CO_2$ laser drill, to perform planar trimming of resistors within the assigned bin in accordance with a predictive trimming formulation. For example, for annular resistors, the resistance value (R) is expressed by equation (1) in terms of the annular ring inner diameter ($d_1$) and outer diameter ($d_2$), resistive body thickness (T) and body resistivity ($\rho$).

$$R(\rho, T, K, d_1, d_2) = \frac{K\rho}{2\pi T} ln\left(\frac{d_2}{d_1}\right) (ohms) \quad (1)$$

The factor K takes into account the reduction in resistance due to manufacturing (e.g., printing, lamination and thermal cycles). Equation (2) expresses the first order change in resistance tolerance for annular resistors with respect to the parameters of equation (1).

$$\frac{\Delta R}{R} = \frac{\Delta d_2}{d_2} - \frac{\Delta d_1}{d_1} + ln\left(\frac{d_2}{d_1}\right)\left[\frac{\Delta \rho}{\rho} - \frac{\Delta T}{T}\right] \quad (2)$$

Equation (2) shows that a change in thickness or planning for annular resistors is multiplied by a natural log factor that is less than one for annular designs. By using the formulation expressed in equation (2), the circuit substrate manufacturer can develop laser drill files that predictively trim annular resistors in a planar manner to provide controlled incremental changes in resistor thickness. In this manner, both small incremental and large resistance value changes can be achieved. The trim application can then use the predicted change in the resistance value associated with each laser drill file to assign the appropriate laser drill file to resistors within the appropriate resistance bin.

The present invention is not limited to any specific passive component shape or methods of manufacturing such passive components. The laser trimming technique for annular resistors illustrated is an example of one component types. The spirit of the present invention may apply to other passive component shapes and to materials other than screened printed resistive materials.

Figure 3:
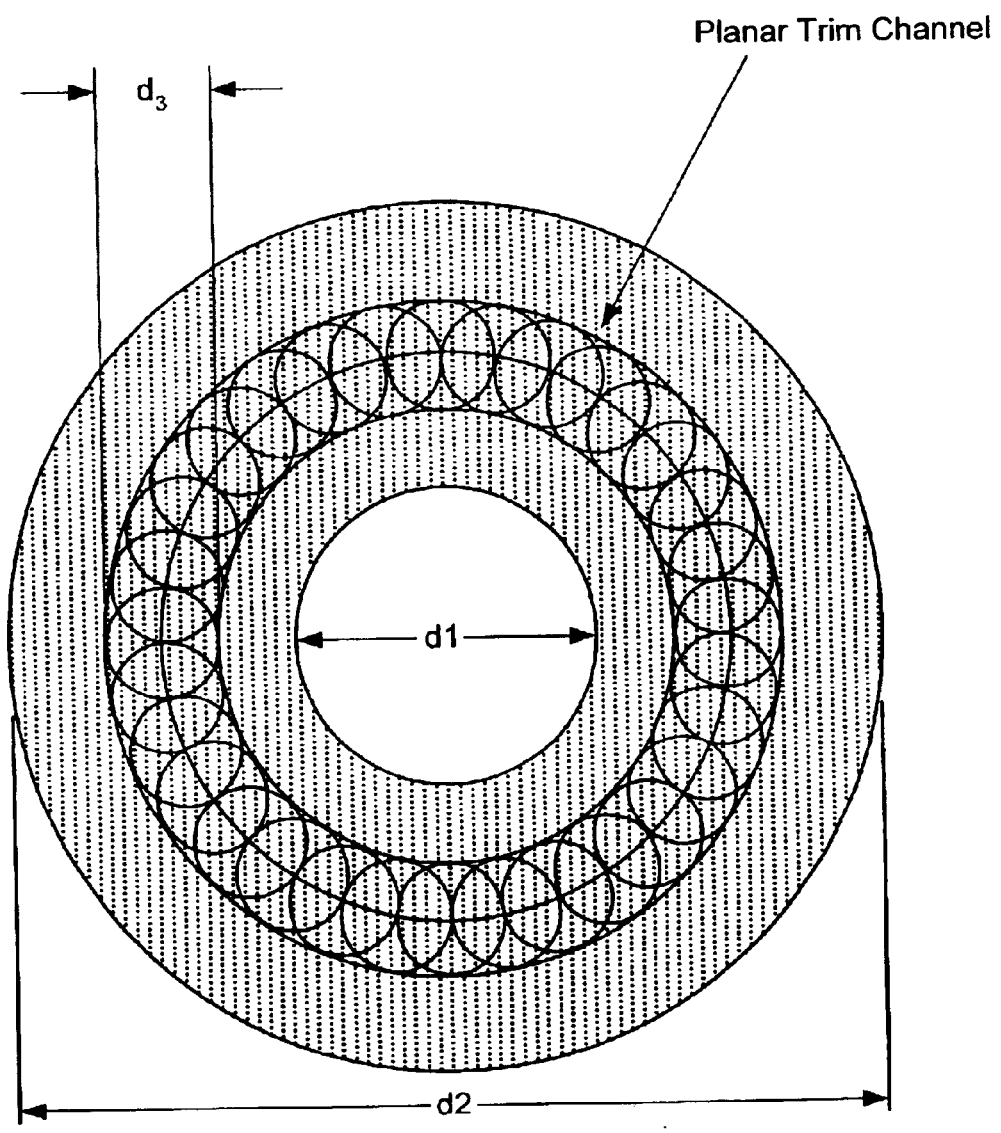
FIG. 3 illustrates an exemplary laser trimming pattern for performing planar trimming of annular resistors in accordance with an embodiment of the present invention.

In accordance with certain exemplary embodiments of the present invention, each laser drill file controls the laser drill to form a planar trim channel within the annular resistor. As illustrated in FIG. 3, exemplary laser drill files may include parameters, such as laser beam spot size, pulse duration, aperture, energy, angle, step size, overlap factor and number of revolutions around the annular resistor, to cause the laser drill to perform a drill pattern on the annular resistor to form the planar trim channel. For example, some embodiments may cause the laser drill to generate a pulse having a predefined aperture diameter ($d_a$) on a portion of the annular resistor, and then move the laser drill and generate another pulse on another portion of the annular resistor. This process may be repeated until the laser drill has carved a planar trim channel within the annular resistor. As in the case of the present example the width of the planar channel is equal to $d_3$ as illustrated in FIG. 3.

In other embodiments of the present invention, once the laser drill has completed one revolution around the annular resistor, the laser drill file may offset the laser drill by a predetermined amount and repeat the pattern in order to form a planar channel having more uniform side walls. Another embodiment may perform one or more revolutions at a relatively high power level in order to produce a relatively large change in resistance value, and then reduce the power level and perform one or more revolutions at a lower power setting in order to produce finer grained changes in resistance value. Still other embodiments may use a relatively large step size for one or more revolutions and a smaller step size on subsequent revolutions. Of course, other embodiments may use combinations of the foregoing processes or another configuration of control parameters to cause the laser drill to form a planar trim channel within the annular resistor.

Referring back to FIG. 2A, after the Sort B has been performed to cause laser drill files to be assigned to respective resistance bins, the drill format button 280 may be used to generate a formatted program that can be uploaded to a laser drill. This formatted program essentially incorporates the location (x, y coordinates) for each resistor into the laser drill file associated with that resistor, and then concatenates the laser drill files for all resistors into a single file. In this way, a single file can be created to perform laser trimming. By automatically generating a formatted program for the laser drill based on the laser drill file associated with each resistance bin, laser trimming in accordance with embodiments of the present invention can avoid the difficult and often time consuming process of assigning laser trimming settings to each individual resistor on the circuit substrate layer. Furthermore, as will be discussed below, laser trimming processes can be easily adjusted by modifying laser trim files associated with individual bins based on measured performance in order to fine tune laser trimming processes.

Figure 2B:
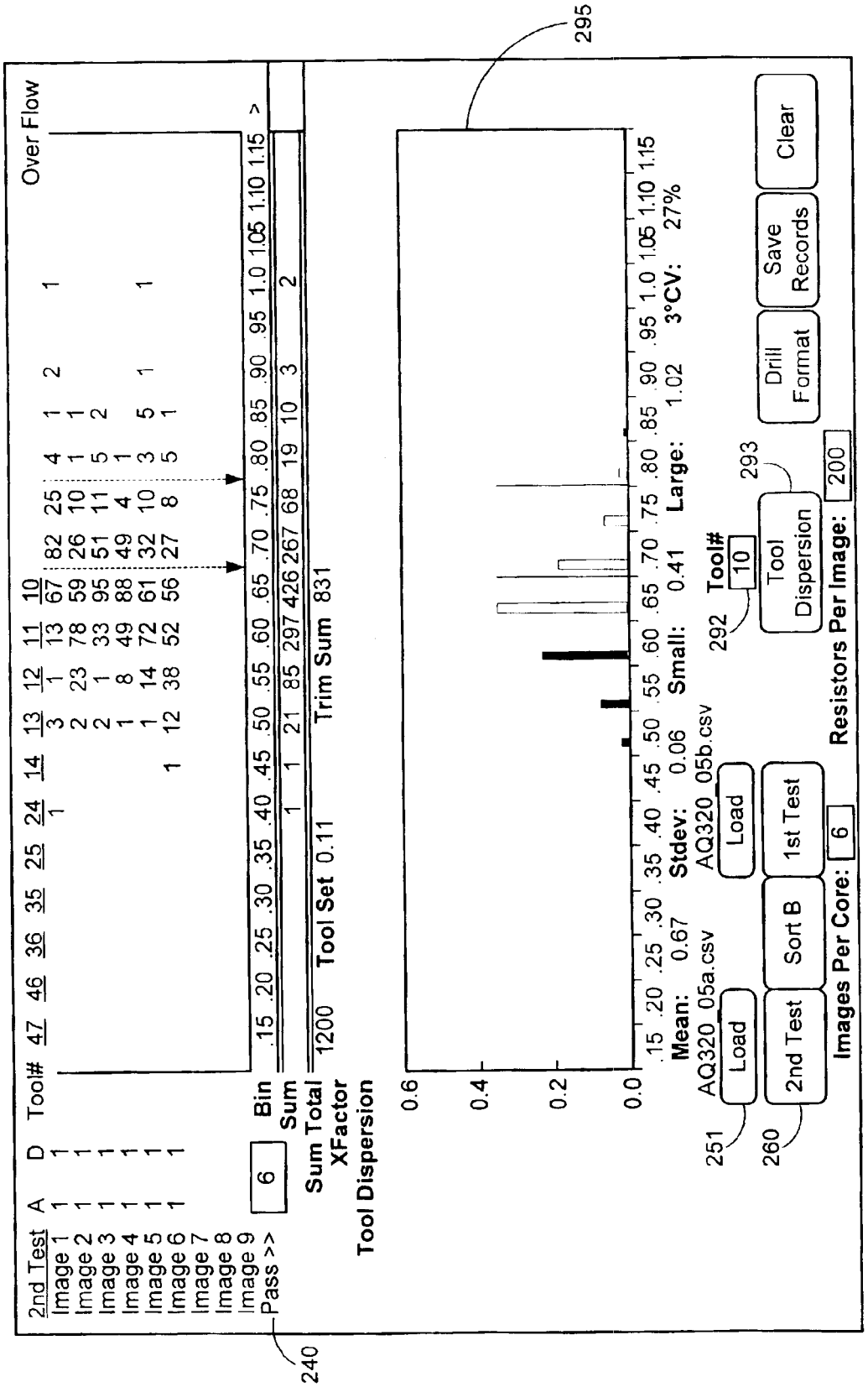
FIG. 2B illustrates exemplary output of the trim tool assignment interface after performing laser trimming in accordance with an embodiment of the present invention.

Referring to FIG. 2B, exemplary output of the trim tool assignment interface after performing laser trimming in accordance with an embodiment of the present invention is illustrated. As discussed above with respect to FIG. 2A, the user can load post-laser trimming data by pressing the second load button 251 and entering the file name that stores the data. The post-laser trimming data can then be viewed by pressing the second test button 260. Comparing FIG. 2A and 2B, the resistance values for all images after laser trimming are much closer to target tolerances than the resistance values before laser trimming. Furthermore, all six images in this example have passed the applicable acceptance criteria after laser trimming as indicated by the pass parameter 240.

In order to further refine the laser trimming process, the exemplary interface of FIG. 2B also includes tools for monitoring and adjusting the performance of individual laser drill files. By entering the laser drill file number in box 292 and pressing the tool dispersion button 293, the user can view the distribution of resistance values for resistors trimmed using that particular laser drill file number in box 295. This information may be used to adjust the laser drill file by, for example, adjusting the power levels, step size, number of revolutions or other configuration parameters.

Referring to FIGS. 4A and 4B, exemplary yields achieved by processes performed in accordance with embodiments of the present invention are illustrated. In both tables, the first test give resistance results after screen print, and the second test give resistance results after laser trimming in accordance with embodiments of the present invention. The yield columns give pass/fail results for the nominal averages listed above the columns. The reason for the nominal change from 0.70 ohm for the first two tests to 0.60 ohm for the final test has to do with the resistive material behavior through the lamination process. As illustrated in FIGS. 4A and 4B, the cores experienced very low yield using a screen printing process alone. However, after performing laser trimming in accordance with embodiments of the present invention, the yields increased to 96% and 87%, respectively.

FIG. 5 illustrates exemplary yields for layered circuit boards achieved by processes performed in accordance with embodiments of the present invention. The table illustrated in FIG. 5 shows the results after combining the results for the resistor core layers illustrated in FIGS. 4A and 4B. Because the multilayer printed circuit board of FIG. 5 include two buried core layers, the individual yields for the two layers must be optimized to achieve the best overall yield. As illustrated in FIG. 5, there was very little yield loss after lamination as shown by the 85% yield after final test for the individual images. These results illustrate the advantages of using embodiments of the present invention in overcoming the unusually low yields typically experienced by embedded passive components in multi-layer printed circuit boards and other circuit platforms such as multichip modules, hybrid circuits and chip packages.

While the present invention has been described with reference to exemplary embodiments, it will be readily apparent to those skilled in the art that the invention is not limited to the disclosed or illustrated embodiments but, on the contrary, is intended to cover numerous other modifications, substitutions, variations and broad equivalent arrangements that are included within the spirit and scope of the following claims.

What is claimed is:

1. A method for laser trimming resistors, the method comprising:

measuring a resistance value for each resistor of a set of resistors on a circuit substrate layer;

sorting the resistors into one or more bins based on the measured resistance values and target resistance values associated with each resistor;

assigning a laser trim file to each bin based on a predictive trim formulation, each laser trim file defining a set of configuration parameters for a laser drill to conform each resistor with their respective target value; and using the laser drill to trim the resistors within each bin in accordance with the laser trim file assigned to that bin;

wherein the laser trim file further defines a drill pattern on the resistor to form a planar channel within the resistor.

2. The method of claim 1, wherein the configuration parameters defined by the laser trim file include at least a spot size and power level for the laser drill.

3. The method of claim 1, wherein the resistors comprise annular resistors.

4. The method of claim 3, wherein the laser trim file includes at least a step size, an overlap factor and number of feed steps over the resistor to form the planar channel.

5. The method of claim 1, further comprising:
measuring a resistance value of each trimmed resistor associated with a particular bin; and
adjusting the laser trim file associated with the particular bin based on a distribution of the measured resistance values of the trimmed resistors within the particular bin.

6. The method of claim 1, further comprising:
measuring a resistance value of each trimmed resistor associated with a particular bin; and
displaying a distribution of the trimmed resistance values to assess performance of the laser drill file associated with the particular bin.

7. The method of claim 1, further comprising displaying a distribution of the measured resistance values associated with each bin to assess performance of an underlying passive component formation process.

8. The method of claim 1, wherein the circuit substrate layer comprises a printed circuit board.

9. A system for laser trimming resistors formed on a circuit substrate layer, the system comprising:
a tester configured to measure a resistance value for each resistor of a set of resistors formed on a circuit substrate layer;
a trim application configured to:
sort the resistors into one or more bins based on the measured resistance values and target resistance values associated with each resistor; and
assign a laser trim file to each bin based on a predictive trim formulation to conform each resistor with their respective target value; and
a laser drill configured to trim the resistors within each bin in accordance with the laser trim file assigned to that bin, each laser trim file defining a set of configuration parameters for the laser drill;
wherein the laser trim file further defines a trim pattern on the resistor to form a planar channel within the resistor.

10. The system of claim 9, wherein the configuration parameters defined by the laser trim file include at least a spot size and power level for the laser drill.

11. The system of claim 9, wherein the resistors comprise annular resistors.

12. The system of claim 11, wherein the laser trim file includes at least a step size, an overlap factor and number of feed steps over the resistor to form the planar channel.

13. The system of claim 9, wherein the circuit substrate layer comprises a printed circuit board.

14. The system of claim 9, wherein the tester is further configured to measure a resistance value of each trimmed annular resistor associated with a particular bin.

15. The system of claim 14, wherein the laser trim application is further configured to adjust the laser trim file associated with the particular bin based on a distribution of the measured resistance values of the trimmed resistors within the particular bin.

16. The system of claim 14, wherein the laser trim application is further configured to display a distribution of the trimmed resistance values to assess performance of the laser drill file associated with the particular bin.

17. The system of claim 9, wherein the laser trim application is further configured to display a distribution of the measured resistance values associated with each bin to assess performance of an underlying passive component formation process.

18. A computer program product comprising:
a computer usable medium having computer readable program code embodied therein, the computer readable program code comprising:
computer readable program code that receives a resistance value for each resistor of a set of resistors on a circuit substrate layer;
computer readable program code that sorts the resistors into one or more bins based on the measured resistance values and target resistance values associated with each resistor;
computer readable program code that assigns a laser trim file to each bin based on a predictive trim formulation, each laser trim file defining a set of configuration parameters for a laser drill to conform each resistor with their respective target value; and
computer readable program code that outputs, for uploading to the laser drill, a file having assignment of the respective resistors to respective laser trim files.

19. The computer program product of claim 18, wherein the configuration parameters defined by the laser trim file include at least a spot size and power level for the laser drill.

20. The computer program product of claim 18, wherein the resistors comprise annular resistors.

21. The computer program product of claim 18, wherein the laser trim file includes at least a step size, an overlap factor and number of feed steps over the resistor to form the planar channel.

22. The computer program product of claim 18, further comprising:
computer readable program code that receives a resistance value of each trimmed annular resistor associated with a particular bin; and
computer readable program code that adjusts the laser trim file associated with the particular bin based on a distribution of the measured resistance values of the trimmed annular resistors within the particular bin.

23. The computer program product of claim 18, further comprising:
computer readable program code that receives a resistance value of each trimmed resistor associated with a particular bin; and
computer readable program code that displays a distribution of the trimmed resistance values to assess performance of the laser drill file associated with the particular bin.

24. The computer program product of claim 18, further comprising computer readable program code that displays a distribution of the measured resistance values associated with each bin to assess performance of an underlying passive component formation process.

25. The computer program product of claim 18, wherein the circuit substrate layer comprises a printed circuit board.

26. The computer program product of claim 18, wherein the laser trim file further defines a drill pattern on the resistor to form a planar channel within the resistor.

27. A computer software tool for use in laser trimming comprising:
a library of laser trim files, each laser trim file defining a set of configuration parameters for a laser drill to conform each resistor with their respective target value;
a computer usable medium having computer readable program code embodied therein, the computer readable program code comprising:
computer readable program code that receives a resistance value for each resistor of a set of resistors on a circuit substrate layer;

computer readable program code that sorts the resistors into one or more bins based on the measured resistance values and target resistance values associated with each resistor;

computer readable program code that assigns a laser trim file from the library to each bin based on a predictive trim formulation; and computer readable program code that outputs, for uploading to the laser drill, a file having assignment of the respective resistors to respective laser trim files.

28. The computer software tool of claim 27, wherein the configuration parameters defined by the laser trim file include at least a spot size and power level for the laser drill.

29. The computer software tool of claim 27, wherein the laser trim file includes at least a step size, an overlap factor and number of feed steps over the resistor to form the planar channel.

30. The computer software tool of claim 27, wherein the laser trim files comprise an excellon format.

* * * * *